(12) United States Patent
Schwarz et al.

(10) Patent No.: US 9,887,336 B2
(45) Date of Patent: Feb. 6, 2018

(54) OPTOELECTRONIC SEMICONDUCTOR COMPONENT AND METHOD OF PRODUCING AN OPTOELECTRONIC SEMICONDUCTOR COMPONENT

(71) Applicant: OSRAM Opto Semiconductors GmbH, Regensburg (DE)

(72) Inventors: Thomas Schwarz, Regensburg (DE); Frank Singer, Regenstauf (DE)

(73) Assignee: OSRAM Opto Semiconductors GmbH (DE)

(*) Notice: Subject to any disclaimer, the term of this patent is extended or adjusted under 35 U.S.C. 154(b) by 0 days.

(21) Appl. No.: 15/525,759

(22) PCT Filed: Oct. 26, 2015

(86) PCT No.: PCT/EP2015/074743
§ 371 (c)(1),
(2) Date: May 10, 2017

(87) PCT Pub. No.: WO2016/074914
PCT Pub. Date: May 19, 2016

(65) Prior Publication Data
US 2017/0331019 A1    Nov. 16, 2017

(30) Foreign Application Priority Data
Nov. 12, 2014   (DE) .................... 10 2014 116 529

(51) Int. Cl.
*H01L 33/62* (2010.01)
*H01L 25/075* (2006.01)

(52) U.S. Cl.
CPC .......... *H01L 33/62* (2013.01); *H01L 25/0753* (2013.01)

(58) Field of Classification Search
CPC .................... H01L 33/62; H01L 25/0753
See application file for complete search history.

(56) References Cited

U.S. PATENT DOCUMENTS 7,993,979 B2 *  8/2011  Do ................. H01L 21/4832
                                                257/692
2004/0084757 A1 *  5/2004  Seo .............. H01L 21/4828
                                                257/672

(Continued)

FOREIGN PATENT DOCUMENTS

DE   10 2010 024 864 A1   12/2011
DE   10 2012 109 905 A1    4/2014

(Continued)

OTHER PUBLICATIONS

OSRAM OSTAR Headlamp, Datasheet, 13 pages, Oct. 2012.

(Continued)

*Primary Examiner* — David Vu
(74) *Attorney, Agent, or Firm* — DLA Piper LLP (US)

(57) ABSTRACT

An optoelectronic semiconductor component includes a carrier having a carrier top side and an opposing carrier underside, wherein the carrier top sides each have a larger area than the associated carrier undersides, the carrier parts fixedly connect to one another via at least one potting body and the potting body together with the carrier parts represents a bearing component of the semiconductor component so that all carrier undersides end flush with the potting body, the light-emitting semiconductor chips electrically connect in series, the metal layer on the carrier top side is structured into conductor tracks and into electrical connection surfaces, and the electrical connection surfaces on the carrier top side are electrically insulated from the associated carrier underside so that the carrier underside of the carrier part the semiconductor chips are arranged on is potential-free and is completely covered with the metal layer.

15 Claims, 4 Drawing Sheets

(56) References Cited

U.S. PATENT DOCUMENTS

| 2009/0151982 A1 | 6/2009 | Oshika |
| 2009/0166664 A1 | 7/2009 | Park et al. |
| 2014/0177242 A1 | 6/2014 | Nam et al. |
| 2014/0293554 A1 | 10/2014 | Shashkov et al. |

FOREIGN PATENT DOCUMENTS

| EP | 2 530 753 A1 | 12/2012 |
| WO | 2012/034752 A1 | 3/2012 |
| WO | 2012/156514 A1 | 11/2012 |

OTHER PUBLICATIONS

OSRAM OLSON Black Flat, Datasheet, 8 pages, Jan. 2014.
"Nanoceramic coated aluminium as a thermal management substrate," NANOTHERM, 14 pages, Mar. 2015.

\* cited by examiner

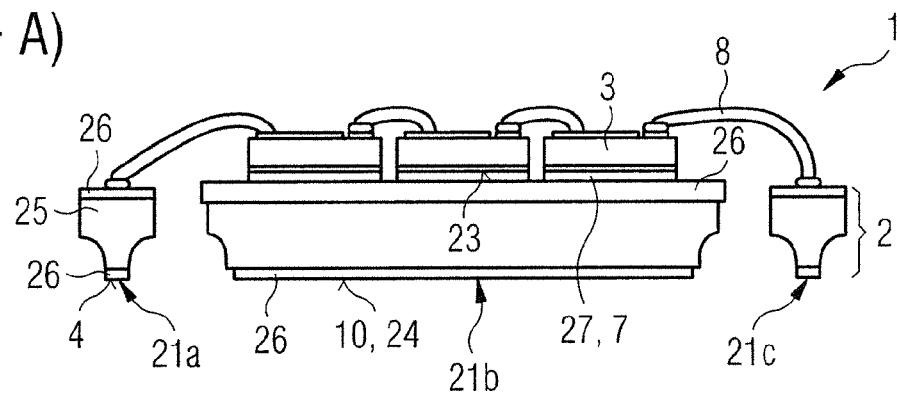
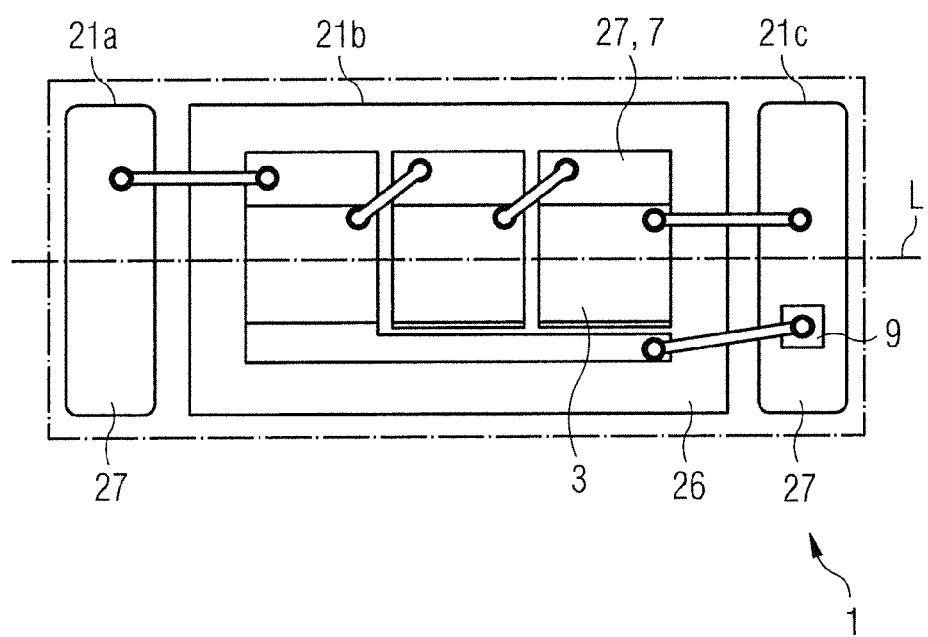

OPTOELECTRONIC SEMICONDUCTOR COMPONENT AND METHOD OF PRODUCING AN OPTOELECTRONIC SEMICONDUCTOR COMPONENT

TECHNICAL FIELD

This disclosure relates to an optoelectronic semiconductor component and a method of producing such an optoelectronic semiconductor component.

BACKGROUND

US 2014/0293554 A1 discloses metal substrates with an electrically insulating ceramic coating. It could be helpful to provide an optoelectronic semiconductor component having a low thermal resistance towards an external carrier.

SUMMARY

We provide an optoelectronic semiconductor component including a carrier having a carrier top side and an opposing carrier underside, several light-emitting semiconductor chips applied to the carrier top side, and electrical contact pads on the carrier underside for external electrical contacting of the semiconductor component, wherein the carrier has a metal core accounting for at least 60% of a thickness of the carrier and contributing to an extent of at least 70% to mechanical rigidity of the carrier, the metal core is directly coated with a ceramic layer having a thickness of at most 100 μm, the ceramic layer is directly coated in places with a metal layer, the semiconductor chips connect electrically to the contact pads via the metal layer, the carrier is formed from several carrier parts, the ceramic layer of each carrier part forms a single, coherent and closed layer around the associated metal core, the carrier top sides each have a larger area than the associated carrier undersides, the carrier parts fixedly connect to one another mechanically via at least one potting body and the potting body together with the carrier parts represents a mechanically bearing component of the semiconductor component so that all carrier undersides end flush with the potting body, the light-emitting semiconductor chips electrically connect in series, the metal layer on the carrier top side on which the semiconductor chips are located is structured into conductor tracks and into electrical connection surfaces, and the electrical connection surfaces on the carrier top side are electrically insulated from the associated carrier underside so that the carrier underside of the carrier part the semiconductor chips are arranged on is potential-free and is completely covered with the metal layer.

We also provide a method of producing the optoelectronic semiconductor component including a carrier having a carrier top side and an opposing carrier underside, several light-emitting semiconductor chips applied to the carrier top side, and electrical contact pads on the carrier underside for external electrical contacting of the semiconductor component, wherein the carrier has a metal core accounting for at least 60% of a thickness of the carrier and contributing to an extent of at least 70% to mechanical rigidity of the carrier, the metal core is directly coated with a ceramic layer having a thickness of at most 100 μm, the ceramic layer is directly coated in places with a metal layer, the semiconductor chips connect electrically to the contact pads via the metal layer, the carrier is formed from several carrier parts, the ceramic layer of each carrier part forms a single, coherent and closed layer around the associated metal core, the carrier top sides each have a larger area than the associated carrier undersides, the carrier parts fixedly connect to one another mechanically via at least one potting body and the potting body together with the carrier parts represents a mechanically bearing component of the semiconductor component so that all carrier undersides end flush with the potting body, the light-emitting semiconductor chips electrically connect in series, the metal layer on the carrier top side on which the semiconductor chips are located is structured into conductor tracks and into electrical connection surfaces, and the electrical connection surfaces on the carrier top side are electrically insulated from the associated carrier underside so that the carrier underside of the carrier part the semiconductor chips are arranged on is potential-free and is completely covered with the metal layer, including providing a metal semi-finished product and forming the semi-finished product into a carrier assembly by at least one of etching, punching and laser cutting so that the metal cores are formed, producing a ceramic layer on the metal cores of the carrier assembly, producing and structuring the metal layer on the ceramic layer so that the electrical contact pads are also formed, fitting and electrically contacting the semiconductor chips, producing at least one potting body, and separating the carrier assembly into the carriers and the optoelectronic semiconductor components.

We further provide an optoelectronic semiconductor component including a carrier having a carrier top side and an opposing carrier underside, several light-emitting semiconductor chips applied to the carrier top side, and electrical contact pads on the carrier underside for external electrical contacting of the semiconductor component, wherein the carrier has a metal core accounting for at least 60% of a thickness of the carrier and contributing to at least 70% to mechanical rigidity of the carrier, the metal core is directly coated with a ceramic layer having thickness of at most 100 μm, the ceramic layer is directly coated in places with a metal layer, the semiconductor chips connect electrically to the contact pads via the metal layer, the carrier is formed from several carrier parts, the ceramic layer of each carrier part forms a single, coherent and closed layer around the associated metal core, the carrier top sides each have a larger area than the associated carrier undersides, and the carrier parts fixedly connect to one another mechanically via at least one potting body and the potting body together with the carrier parts represents a mechanically bearing component of the semiconductor component so that all carrier undersides end flush with the potting body.

BRIEF DESCRIPTION OF THE DRAWINGS

FIGS. 1A, 1B, 2, 3, 4A, 4B, 5A and 5B show schematic representations of practical examples of optoelectronic semiconductor components described herein.

REFERENCE SYMBOL LIST

Figure 1A:
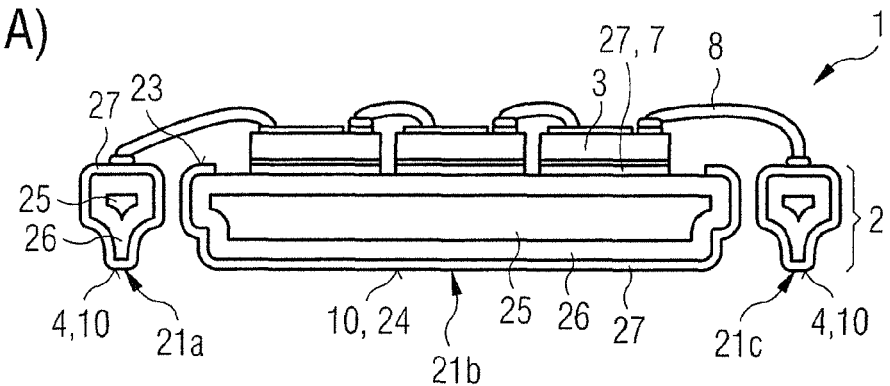

1 Optoelectronic semiconductor component
10 Mounting surface
2 Carrier
20 Carrier assembly
21 Carrier part
22 End face of the carrier
23 Carrier top side
24 Carrier underside
25 Metal core
26 Ceramic layer
27 Metal layer 28 Through hole
3 Light-emitting semiconductor chip
4 Electrical contact pad
5 Potting body
6 Luminescent plate
7 Connection surface
8 Bond wire
9 ESD protection diode
L Longitudinal axis of the carrier
S Separation line

DETAILED DESCRIPTION

Our optoelectronic semiconductor component may comprise a carrier. The carrier has a carrier top side and a carrier underside lying opposite this. The carrier top side and the carrier underside are preferably main sides of the carrier. The carrier top side and/or the carrier underside can be designed flat and planar. It is possible that the carrier is composed of several carrier parts. Alternatively, the carrier can be formed in one piece.

The semiconductor component may comprise one or more light-emitting semiconductor chips. Light-emitting can mean that the semiconductor chip emits radiation with a wavelength of maximal intensity of at least 300 nm or 400 nm or 430 nm and/or at most 950 nm or 680 nm or 550 nm or 495 nm. In particular, the light-emitting semiconductor chips are light-emitting diodes emitting blue light.

It is optionally possible that the semiconductor component has additional semiconductor chips not provided for radiation generation. Semiconductor chips of this kind are protection diodes against damage from electrostatic discharges, for example, or addressing chips or control chips. Only the light-emitting semiconductor chips are considered in greater detail below and the term semiconductor chip describes the light-emitting semiconductor chips below.

The semiconductor chips may be fitted on the carrier top side. For example, the semiconductor chips are soldered on or in particular stuck on in an electrically conductive manner.

The semiconductor component may have two or more than two electrical contact pads on the carrier underside. The electrical contact pads are not directly electrically connected to one another. For example, one of the contact pads is set up as an anode contact and another of the contact pads is set up as a cathode contact. The semiconductor component can be electrically contacted externally via the electrical contact pads. For example, it can be fitted on a circuit board electrically and preferably also mechanically at the same time.

All electrical contact pads may be located on the carrier underside. This can mean that the optoelectronic semiconductor component is surface-mountable, namely that it is a SMT component.

The carrier may have a metal core. The metal core is preferably a homogeneous, solid, monolithic material. The metal core can be formed of a pure metal or, preferably, of a metal alloy. The metal core is electrically conductive.

The metal core may account for at least 40% or 60% or 80% or 90% of an overall thickness of the carrier. The overall thickness of the carrier is to be determined in particular in a direction perpendicular to the carrier top side. Alternatively or additionally, the metal core of the carrier contributes to mechanical rigidity of the carrier to an extent of at least 50% or 70% or 85% or 95%. In other words, the metal core then represents the component stabilizing or substantially stabilizing the carrier. The carrier property of the carrier is then attributed to the metal core. Other components of the carrier have other main functions in this case, regardless of an increase in the bearing capacity of the carrier.

The metal core may be coated in places or completely with a ceramic layer. The ceramic layer is preferably in direct contact with the metal core. The ceramic layer is an electrically insulating, thermally satisfactorily conductive layer. In particular, the ceramic layer is configured for electrical insulation, meaning that when the optoelectronic semiconductor component is used as intended, the ceramic layer acts as an electrical insulation layer.

The ceramic layer may have a thickness of at least 2 µm or 5 µm or 8 µm. Alternatively or in addition, the thickness of the ceramic layer is at most 100 µm or 50 µm or 20 µm or 15 µm. It is possible that the ceramic layer is composed of a plurality of ceramic particles, for example, AlN particles. A mean diameter of the ceramic particles is preferably at least 10 nm or 50 nm and/or at most 500 nm or 250 nm or 120 nm. Such ceramic layers are known, for instance, from US 2014/0293554 A1, the subject matter of which in respect of the ceramic layer is incorporated herein by reference.

A metal layer may be applied in places to the ceramic layer. The metal layer is preferably in direct physical contact with the ceramic layer. The metal layer particularly preferably covers the ceramic layer only incompletely.

The semiconductor chips may electrically connect to the electrical contact pads via the metal layer. This means that an electric current from the contact pads to the semiconductor chips is conducted at least partly via the metal layer. In this case, additional electrical connections, for instance via bond wires, can be present.

The optoelectronic semiconductor component may comprise a carrier with a carrier top side and a carrier underside lying opposite theseto. Several light-emitting semiconductor chips are fitted on the carrier top side. At least two electrical contact pads for an external electrical contacting of the semiconductor component may be located on the carrier underside. The carrier may have a metal core, wherein the metal core accounts for at least 60% of a thickness of the carrier and contributes to an extent of at least 70% to a mechanical rigidity of the carrier. The metal core may at least partially be coated directly with a ceramic layer, the thickness of which is at most 100 µm. The ceramic layer is coated directly in places with a metal layer. The semiconductor chips may electrically connect to the contact pads via the metal layer.

An electrical insulation of the metal core can be achieved by the ceramic layer, wherein the metal core remains thermally conductively contactable. A low-cost construction of the semiconductor component, in particular a QFN-similar construction, can be realized. Furthermore, the semiconductor chips can be arranged spatially closely on the carrier top side and connected in series. Such semiconductor components can be used in the automotive sector, for example, as headlamps, in particular as front headlamps.

In such a semiconductor component, a high thermal conductivity and an efficient spread of heat between the semiconductor chips and an external mounting surface exists by the carrier. This is achieved in particular by the only thin insulation layer in the form of the ceramic layer and by the solid metal core, for instance of a thermally suitably conductive material such as aluminium or copper. At the same time, a separation of the electrical potential to the carrier underside and the electrical contact pads is achievable by the electrically insulating ceramic layer. In this way, simple designs and circuit diagrams can be achieved on the mounting platforms, for example, metal core circuit boards or printed circuit boards, PCBs for short. The distance between the individual semiconductor chips on the carrier no longer plays any significant role when mounting the semiconductor component on the external mounting platform. Due to the use of aluminium or copper in particular as a material for the metal core, a good adaptation of a thermal expansion coefficient of the semiconductor component to metal core circuit boards or printed circuit boards is possible. Furthermore, in a separation process only comparatively little metal is located in a sawing area, due to which high sawing speeds are attainable during the production of the semiconductor components in a separation. The construction of the semiconductor component can also be realized cost-efficiently.

The carrier may be formed from precisely three or from precisely two or from precisely four or from more than four carrier parts. All carrier parts are preferably located here in a common plane. Furthermore, the carrier parts are preferably arranged at a distance from one another, meaning that the carrier parts do not then come into contact.

The semiconductor chips, in particular all semiconductor chips, may be arranged on the largest of the carrier parts. The largest carrier part in this case is a middle part of the carrier parts in particular.

The contact pads may be fitted on two smaller parts of the carrier parts. These smaller carrier parts on which the contact pads are located are preferably externally lying carrier parts. In particular, the largest carrier part with the semiconductor chips can be located between the two outer carrier parts.

The carrier top sides and/or the carrier undersides of all carrier parts may lie in a common plane. In this case, the carrier top sides and the carrier undersides are preferably all formed flat and planar.

The ceramic layer of each carrier part may be a single, coherent and closed layer around the associated metal core. This may apply either viewed in each cross section perpendicular to the carrier top side or at least in a cross section perpendicular to the carrier top side along a longitudinal axis of the carrier. Seen from above, the longitudinal axis may be a longest line of symmetry of the carrier, for example. The longitudinal axis can thus be a longest center line of the carrier, seen in a top view of the carrier top sides.

The metal cores of all carrier parts may be formed from the same semi-finished product, in particular sheet metal semi-finished product. The shaping to form the metal cores may take place via punching, etching, sawing and/or laser cutting, for example. Since the metal cores are formed from the same sheet metal product, all metal cores preferably have the same material composition and thickness.

The carrier part on which the semiconductor chips are fitted may be free of the electrical contact pads. In other words, this carrier part, on which the semiconductor chips are located, is not provided for an electrical contacting of the semiconductor component outwardly.

The carrier top sides of the carrier parts may each have a larger area than the associated carrier undersides or vice-versa. In this case, the carrier undersides are preferably a reduced carrier top side. In other words, the carrier top sides and the carrier undersides can be placed congruently above one another via a scaling factor.

Adjacent carrier parts may have a smaller spacing respectively on the carrier top sides than on the associated carrier undersides. This is achieved, for example, in that a gap between the corresponding, adjacent carrier parts on the carrier top sides has a smaller width than on the carrier undersides. This can be realized, for example, by etching of the semi-finished product from which the carrier parts are formed from two opposing sides.

The carrier parts may fixedly mechanically connect to one another via one or more casting bodies. This means that in use of the semiconductor component as intended, the carrier parts do not detach from the potting body and vice-versa. Mechanical integrity is thus produced by the potting body.

The at least one potting body, together with the carrier parts, may represent the mechanical bearing component of the semiconductor component. Other components of the semiconductor component do not then contribute to mechanical stabilization, or only contribute to a subordinate extent.

All carrier undersides may end flush with the potting body. A flat mounting surface can thus be produced. The mounting surface comprises the carrier undersides and an underside of the potting body.

The semiconductor component may have a light-impermeable first potting body. The first potting body preferably ends flush with the carrier top sides and the carrier underside. The potting body can also end flush with end faces of the carrier, wherein the end faces connect carrier undersides and carrier top sides to one another. This flush finishing preferably exists with a tolerance of at most 25 µm or 10 µm or 5 µm or 0.5 µm. In other words, the first potting body is then limited to a region in the direction perpendicular to the carrier top side in which the carrier parts are also located.

The semiconductor component may have a second potting body. The second potting body may be formed translucent or reflective for the radiation produced in operation of the semiconductor component. The second potting body can end flush with the end faces of the carrier and/or with the carrier top side and/or with the side faces of the semiconductor chips. In a plane, in which the carrier top sides are located, the second potting body can be in direct contact with the first potting body, in particular in areas between the carrier parts when seen from above.

The semiconductor component may have at least three or at least five light-emitting semiconductor chips. The semiconductor chips, preferably all light-emitting semiconductor chips, electrically connect in series.

The metal layer on the carrier top side of the carrier part on which the semiconductor chips are fitted may be structured into electrical conductor tracks and/or electrical connection surfaces. For example, precisely one of the semiconductor chips is then fitted on each electrical connection surface.

The electrical connection surfaces may be electrically insulated from the carrier underside of the associated carrier part. This electrical insulation can be achieved on the one hand by a structuring into the connection surfaces and on the other hand by the electrically insulating ceramic layer.

The semiconductor chips may electrically contact respectively on two opposing main sides. For example, one of the main sides is designed as a flat electrical contact and the other main side comprises a connection area for a bond wire, for instance. Alternatively it is possible that the semiconductor chips are flip chips. In this case, the semiconductor chips can be fitted on two different electrical connection surfaces and connected electrically to these. It is further possible that in the case of flip chips, the semiconductor chips are not electrically connected to any of the connection surfaces. It can then be the case that the connection surfaces are used additionally or exclusively as mechanical attachment surfaces and electrical contacting takes place only via bond wires, for example.

The semiconductor component may have one or more luminescent plates. The luminescent plates can be produced separately. This can mean that the luminescent plates are produced separately from other constituents of the semiconductor component with respect to their shape. In particular, the luminescent plates are mechanically self-supporting and are built into the semiconductor component in a mechanically self-supporting state.

Precisely one of the luminescent plates may be associated with precisely one of the semiconductor chips in each case. In other words, a clear association may then exist between the semiconductor chips and the luminescent plates. Alternatively, one luminescent plate can be associated with several of the semiconductor chips.

The luminescent plates may each lie congruently over one of the semiconductor chips when viewed from above. It is preferable that adjacent luminescent plates do not come into contact. The luminescent plates may be configured respectively for a partial or complete transformation of light of the associated semiconductor chip into longer-wave light. In particular, green, yellow and/or red light is produced via the luminescent plates. The light directly from the semiconductor chips and the longer-wave light of the luminescent material can mix to give light of a mixed color, in particular to give white light.

The luminescent plates may end, in a direction away from the carrier, flush with the potting body. A top side of the semiconductor component may then be formed by the luminescent plates together with the potting body.

The luminescent plates may have a thickness of at least 10 µm or 25 µm and/or at most 500 µm or 250 µm or 75 µm. The luminescent plates are also preferably located close to the associated semiconductor chip. A mean distance between the associated semiconductor chip and the luminescent plate is then preferably 25 µm or 10 µm or 5 µm at most. For example, the luminescent plates are adhered to the associated semiconductor chip by a silicone. The luminescent plates can have luminescent particles and a matrix material into which the luminescent particles are embedded. Alternatively it is possible that the luminescent plates are formed, for instance, from a luminescent ceramic.

The ceramic layer may be limited to the carrier top side of the carrier part on which the semiconductor chips are mounted. In other words, only an electrical insulation between the semiconductor chips and the metal core of the relevant carrier part may then exist due to the ceramic layer. The other carrier parts, on which no semiconductor chips are located, can thus be free of the ceramic layer.

The metal core of one of the carrier parts or of all of the carrier parts may be provided all around and completely with the ceramic layer. In other words, the metal core is not then free at any point.

The metal core may be formed of aluminium, of copper, of a copper alloy or of an aluminium alloy. The ceramic layer is preferably formed from a ceramic that has a main constituent of the metal core, for example, aluminium or copper. If the metal core is an aluminium core, the ceramic may then comprise aluminium nitride and/or aluminium oxide, for example, or consists of these.

The metal layer may comprise or consist of one or more of the materials named below, in one or also in several partial layers of the metal layer: Al, Ag, Au, Cu, Ni, Pd, Pt.

The carrier parts each may have, in a direction away from the carrier top side, a constant width initially and directly following on from this the carrier parts taper up to the carrier underside when seen in cross section. The area of a constant width may affect at least 10% or 20% and/or at most 60% or 40% of the overall thickness of the carrier, for example.

We also provide a method of producing such an optoelectronic semiconductor component. Features of the method are therefore also disclosed for the optoelectronic semiconductor component and vice-versa.

In at least one example, the method comprises at least or exclusively the following steps, preferably in the order indicated:

provision of a semi-finished metal product and shaping of the semi-finished product into a carrier assembly by etching, punching, sawing, cutting and/or laser treatment so that the metal cores are formed, production of the ceramic layer on the metal cores of the carrier assembly, production and structuring of the metal layer on the ceramic layer so that the electrical contact pads are also formed, application and electrical contacting of the semiconductor chips, production of at least one potting body, and separation of the carrier assembly into the carriers and the optoelectronic semiconductor components.

The carrier assembly may have the carriers and their carrier parts as well as connecting webs, which connect the carriers and the carrier parts mechanically to one another. These connecting webs may be partially or completely removed and/or split when separating the carrier assembly. At least up to production of the potting body, the carrier assembly is mechanically stabilized by the connecting webs and can be handled as a single component. Alternatively to the connecting webs, it is possible that the carriers and the carrier parts are mounted on a temporary carrier film, for instance by gluing.

The carrier parts may be provided all over with the ceramic layer, with the exception of surfaces that arise on separation into the semiconductor components, in particular by splitting of the connecting webs.

An optoelectronic semiconductor component described here is explained in greater detail below with reference to the drawing and to practical examples. The same reference signs indicate identical elements in the individual figures. However, no references to scale are shown, but rather individual elements can be shown on an exaggeratedly large scale for a better understanding.

Figure 1B:
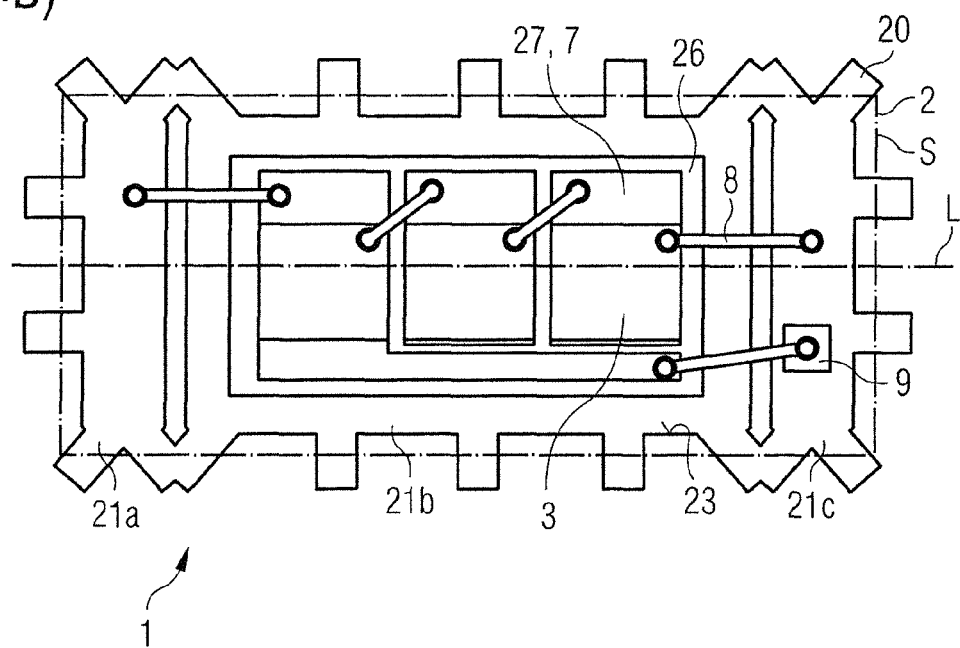

A practical example of an optoelectronic semiconductor component 1 is shown in FIG. 1B in a top view and in FIG. 1A in a sectional view along a longitudinal axis L. Seen from above, the longitudinal axis L is a longest central axis of a carrier 2 and/or of the semiconductor component 1.

The semiconductor component 1 has a carrier 2. The carrier 2 is formed by three carrier parts 21a, 21b, 21c spaced at a distance from one another. Each of the carrier parts 21a, 21b, 21c comprises a metal core 25. A ceramic layer 26 is applied to each of the metal cores 25. Seen in cross section, see FIG. 1A, the ceramic layers 26 are a continuous, coherent and closed layer around the associated metal core 25 in each case. A metal layer 27 is applied to each of the ceramic layers 26. The metal layers 27 are produced by vapor deposition or electroplating, for example.

The carrier 2 has a carrier underside 24 and a carrier top side 23 lying opposite this. Several light-emitting semiconductor chips 3, in particular light-emitting diode chips, are mounted on the carrier top side 23. On the carrier top side 23 the metal layer 27 is structured into several electrical connection surfaces 7. One of the semiconductor chips 3 is mounted in each case on precisely one of the connection surfaces 7 and connects to this connection surface 7 electrically and mechanically. A series connection of the semiconductor chips 3 is realized by way of the structuring of the metal layer 27 into the connection surfaces 7. The semiconductor chips 3 are not in direct electrical contact in this case with the underside 24 of the largest carrier part 21b, which is located centrally between the smaller carrier parts 21a, 21c, seen along the longitudinal axis L. An underside of the central carrier part 21b is thus potential-free.

Electrical contacting of the semiconductor component 1 is accomplished by the two outer carrier parts 21a, 21c. Located on their undersides are electrical contact pads 4, with which the semiconductor component 1 can be electrically contacted externally. An external mounting carrier is not shown in the respective illustrations. An electrical connection of the carrier parts 21a, 21c to the central carrier part 21b is produced via bond wires 8.

An ESD protection diode 9 is optionally mounted on one of the carrier parts, as also in all other practical examples. The ESD protection diode 9 connects electrically in parallel in semiconductor chips 3.

In the view from above in FIG. 1B, a carrier assembly 20 is indicated with several of the carriers 2. A dashed and dotted line running around the carrier 2 represents in particular a separation line S, at which the carrier assembly 20 can be separated into the individual carriers 2. Adjacent carriers 2 connect to one another via connecting webs, which are not drawn in completely. Only the connecting webs are located along the separation line S so that on splitting into the individual carriers 2, for instance by sawing, only a little hard, in particular metallic and/or ceramic material is to be penetrated. Separation into the carriers 2 and semiconductor components 1 preferably takes place following production of a potting body not shown in FIG. 1, compare also FIGS. 2 and 3.

On the carrier undersides 24, a distance between the adjacent carrier parts 21a, 21b, 21c is greater than on the carrier top sides 23. This can be realized, for example, by different etching processes from the carrier top side 23 and from the carrier underside 24. Due to the bigger distance between the carrier parts 21a, 21b, 21c on the carrier undersides 24, greater positioning tolerances can be achieved on an external mounting carrier.

To produce the semiconductor component 1, a semi-finished product of a material of the metal cores 25 in particular is first provided. This semi-finished product is then structured into the carrier assembly 20, for example, by etching from the undersides 24 and the top sides 23. For this two photo planes in particular, each from a main side of the carrier assembly 20, are required.

The ceramic layer 26 is then applied and the metal layer 27 is applied. Then, the metal layer 27 is structured into the connection surfaces 7, in particular via a third photo plane. After that the semiconductor chips 3 and the optional ESD protection diode 9 are applied and connected electrically via the bond wires 8.

Following application and/or connection of the semiconductor chips 3, electrical and/or optical testing of the components can be carried out still in the carrier assembly 20. After optional testing, the potting body, which is not shown in FIG. 1, is produced, via which the carrier parts 21a, 21b, 21c are fixedly connected to one another mechanically.

Following the production of the potting body not shown in FIG. 1, separation takes place along the separation line S, for instance by sawing. The sawing thus takes place substantially only through the potting body.

Figure 2:
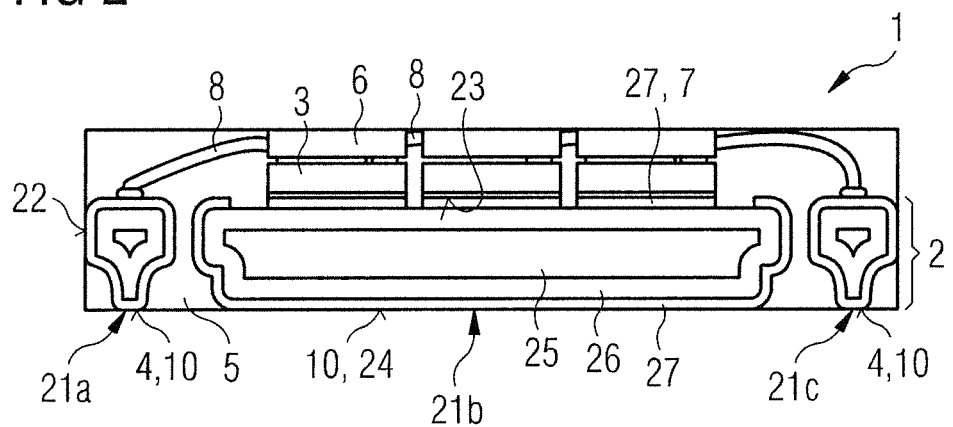

In the practical example as shown in the sectional view in FIG. 2, a separate luminescent plate 6 is assigned in each case to the semiconductor chips 3. White light can be produced, for example, via the radiation produced by the semiconductor chips 3, together with the luminescent plate 6. The luminescent plates 6 can all be identical in construction or can also have different luminescent materials or mixtures of luminescent materials. The luminescent plates are silicone plates, for example, to which luminescent particles have been added, or are luminescent ceramic plates.

Following application of the luminescent plates 6, which can also be present in all other practical examples, the potting body 5 is produced. The potting body 5 is preferably translucent or reflective for the light produced. The potting 5 is produced from a thermoplastic resin, epoxy, silicone or epoxy-silicone hybrid material as base material, for example. Absorbent or preferably reflective particles, for instance of titanium dioxide, for example, are added to the base material of the potting body 5.

The bond wires 8 preferably do not overtop the luminescent plates 6 in the direction away from the carrier top side 23. The potting body 5 and the luminescent plates 6 can end flush with one another in the direction away from the carrier top side 23. Alternatively, it is possible for the potting body 5 to cover the luminescent plates 6 in a view from above.

At end faces 22 of the carrier 2, the potting body 5 and the external conductor frame parts 21a, 21c likewise end flush with one another. Alternatively, the potting body 5 can even protrude beyond the carrier parts 21a, 21b, 21c in a lateral direction so that, seen from above, the carrier parts 21a, 21b, 21c can be completely enclosed all around by a material of the potting body 5. A corresponding arrangement is also possible in all other practical examples.

Figure 3:
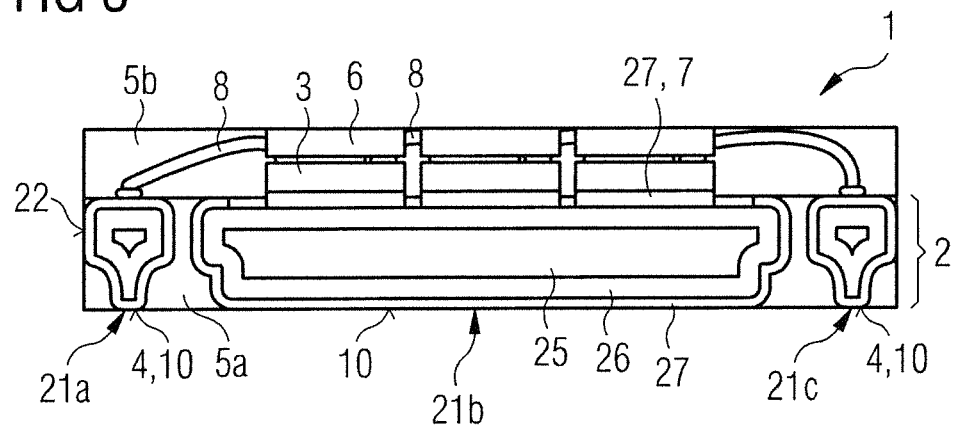

In the practical example as shown in the sectional view in FIG. 3, the semiconductor component 1 has a first potting body 5a and a second potting body 5b. The first potting body 5a is designed to be impermeable to radiation, for example, produced from a dark or black epoxy material or thermoplastic resin, for example. The translucent or reflective second potting body 5b can be designed as explained in connection with FIG. 2.

Due to the division into the first potting body 5a and into the second potting body 5b, the mechanical properties and the optical properties can be controlled separately from one another. Thus the first potting body 5a, for example, which is located in the same area as the carrier 2 when seen in cross section, is controlled for a mechanical connection of the carrier parts to one another.

The practical example according to FIG. 3 otherwise corresponds to the practical example as shown in FIG. 2. Diverging from the representations in FIGS. 2 and 3, it is possible, as in all other practical examples also, that the end faces 22 of the carrier 2 and lateral surfaces of the potting bodies 5, 5a, 5b run obliquely to the mounting surface 10, thus at an angle not equal to 90°. It is also possible that a step is formed in the end faces 22 or in the lateral surfaces of the potting bodies 5, 5a, 5b. Such oblique or stepped lateral surfaces occur, for example, during splitting into the semiconductor components 1, for instance by sawing with V-shaped saw blades or by sawing from two opposing sides, for instance using saw blades of different widths.

Another practical example of the semiconductor component 1 is illustrated in FIG. 4A in a sectional view along the longitudinal axis L and in FIG. 4B in a view from above. To simplify the representation, the potting body is not included in FIG. 4.

In FIG. 4 only the largest, central carrier part 21b is provided with the ceramic layer 26 on the metal core 25 on the carrier top side 23. The metal layer 27 also extends only on the carrier top sides 23 and carrier undersides 24 and not on lateral surfaces of the carrier parts 21a, 21b, 21c. The semiconductor component according to FIG. 4 can be represented analogously to the semiconductor component in FIG. 1. Diverging from this preferably only two photo planes and one shadow mask are required.

Due to the only thin ceramic layer 26, an electrical insulation can be achieved on the one hand and on the other hand a thermal resistance through the carrier 2 to an external heat sink or an external mounting carrier is low. A higher surface density of the semiconductor chips 3 on the carrier top side 23 can also be realized by this.

Figure 5A:
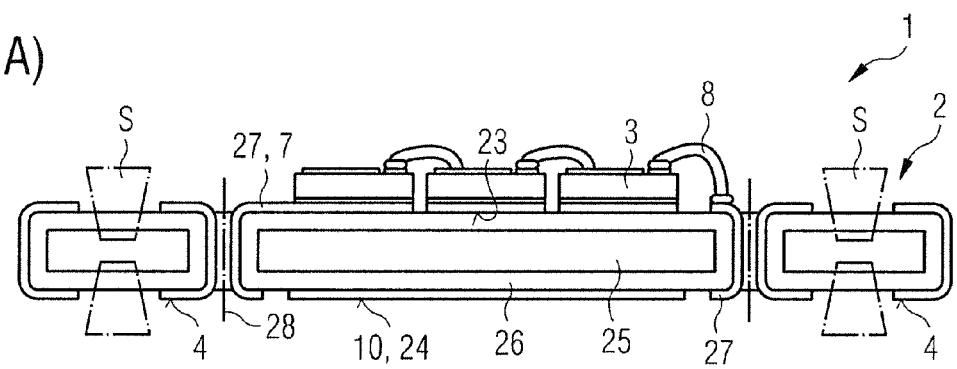
Figure 5B:
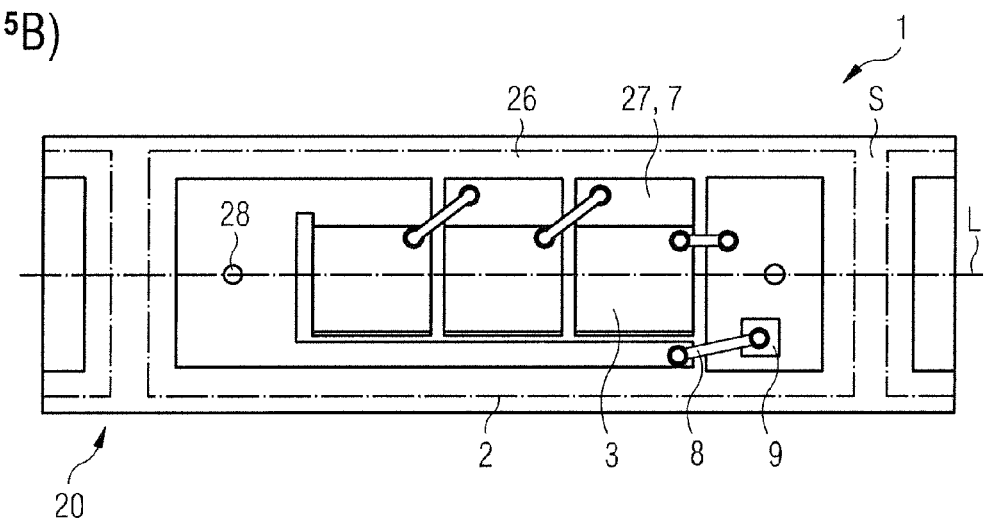

In the next practical example, see the sectional view in FIG. 5A and view from above in FIG. 5B, the carrier 2 is formed in one piece. An electrical connection between the carrier top side 23 and the carrier underside 24 is realized via through holes 28, which are provided with the metal layer 27. Separation into the semiconductor components takes place in particular by notching and breaking in the separation regions S. The through holes 28 can be produced via a first photo plane. The connection surfaces 7 can be structured from the metal layer 27 with a second photo plane.

Unlike the practical examples in FIGS. 1 to 4, the underside of the single carrier part, on which the semiconductor chips 3 are mounted, is not potential-free. The electrical contact pads 4 are fitted on this underside 24.

Our components and methods described herein are not restricted by the description with reference to the practical examples, but rather this disclosure comprises every new feature and every combination of features, which includes in particular every combination of features in the appended claims, even if the feature or combination is not itself explicitly indicated in the claims or practical examples.

This application claims priority of DE 10 2014 116 529.2, the subject matter of which is incorporated herein by reference.

The invention claimed is:

1. An optoelectronic semiconductor component comprising:
   a carrier having a carrier top side and an opposing carrier underside,
   several light-emitting semiconductor chips applied to the carrier top side, and
   electrical contact pads on the carrier underside for external electrical contacting of the semiconductor component,
   wherein
   the carrier has a metal core accounting for at least 60% of a thickness of the carrier and contributing to an extent of at least 70% to mechanical rigidity of the carrier,
   the metal core is directly coated with a ceramic layer having a thickness of at most 100 μm,
   the ceramic layer is directly coated in places with a metal layer,
   the semiconductor chips connect electrically to the contact pads via the metal layer,
   the carrier is formed from several carrier parts,
   the ceramic layer of each carrier part forms a single, coherent and closed layer around the associated metal core,
   the carrier top sides each have a larger area than the associated carrier undersides,
   the carrier parts fixedly connect to one another mechanically via at least one potting body and the potting body together with the carrier parts represents a mechanically bearing component of the semiconductor component so that all carrier undersides end flush with the potting body,
   the light-emitting semiconductor chips electrically connect in series,
   the metal layer on the carrier top side on which the semiconductor chips are located is structured into conductor tracks and into electrical connection surfaces, and
   the electrical connection surfaces on the carrier top side are electrically insulated from the associated carrier underside so that the carrier underside of the carrier part the semiconductor chips are arranged on is potential-free and is completely covered with the metal layer.

2. The optoelectronic semiconductor component according to claim 1, wherein the carrier is formed of precisely three separate carrier parts spaced at a distance from one another,
   the carrier parts are arranged in a common plane and spaced at a distance from one another, and
   the semiconductor chips are arranged on a biggest, central one of the carrier parts and the contact pads are located on the two smaller, outer carrier parts.

3. The optoelectronic semiconductor component according to claim 2, wherein the carrier top sides and the carrier undersides of all carrier parts are formed flat and lie in a common plane, and
   the metal cores of all carrier parts are formed from the same semi-finished sheet metal product by at least one of punching, etching and sawing.

4. The optoelectronic semiconductor component according to claim 1, wherein the carrier part on which the semiconductor chips are mounted is free from the contact pads, and
   a distance between adjacent carrier parts on the carrier top sides is respectively smaller than on the associated carrier undersides.

5. The optoelectronic semiconductor component according to claim 1, wherein the semiconductor component has a flat mounting surface comprising the carrier undersides.

6. The optoelectronic semiconductor component according to claim 1, further comprising a light-impermeable first potting body and a translucent second potting body, wherein the first potting body ends flush with the carrier top sides and the carrier undersides as well as flush with the end faces of the carrier, with a tolerance of at most 25 μm in each case.

7. The optoelectronic semiconductor component according to claim 1, comprising at least three of the light-emitting semiconductor chips.

8. The optoelectronic semiconductor component according to claim 1, wherein the semiconductor chips are each contacted electrically on two opposing main sides and are each in direct electrical contact with one of the electrical connection surfaces and are mechanically attached to the corresponding connection surface.

9. The optoelectronic semiconductor component according to claim 1, further comprising several separately produced luminescent plates, each associated with one of the semiconductor chips and configured for a partial conversion of light of the associated semiconductor chip into longer-wave light.

10. The optoelectronic semiconductor component according to claim 9, wherein the luminescent plates end flush with the potting body in the direction away from the carrier, and an average thickness of the luminescent plates is 25 μm to 250 μm and an average distance of the luminescent plates from the associated semiconductor chip is 10 μm at most.

11. The optoelectronic semiconductor component according to claim 1, wherein, in a direction away from the carrier top side, the carrier parts each have a constant width initially and following on from this, and the carrier parts taper down to the carrier underside when seen in cross section.

12. The optoelectronic semiconductor component according to claim 1, wherein the metal core is completely coated by the ceramic layer and has a thickness of at least 2 μm and at most 15 μm,
   the ceramic layer is produced from AlN particles with an average diameter of at most 250 nm, and
   the metal core consists of Al, Cu or an alloy with Al or Cu and the metal layer comprises at least one of Al, Ag, Au, Cu, Ni, Pd and Pt.

13. A method of producing the optoelectronic semiconductor component according to claim 1, comprising:
   providing a metal semi-finished product and forming the semi-finished product into a carrier assembly by at least one of etching, punching and laser cutting so that the metal cores are formed,
   producing a ceramic layer on the metal cores of the carrier assembly,
   producing and structuring the metal layer on the ceramic layer so that the electrical contact pads are also formed,
   fitting and electrically contacting the semiconductor chips,
   producing at least one potting body, and
   separating the carrier assembly into the carriers and the optoelectronic semiconductor components.

14. The method according to claim 13, wherein the steps are executed in the specified order, and in forming the semi-finished product into the carrier assembly, etching of two opposing main sides of the semi-finished product takes place.

15. An optoelectronic semiconductor component comprising:
   a carrier having a carrier top side and an opposing carrier underside,
   several light-emitting semiconductor chips applied to the carrier top side, and
   electrical contact pads on the carrier underside for external electrical contacting of the semiconductor component,
wherein
   the carrier has a metal core accounting for at least 60% of a thickness of the carrier and contributing to at least 70% to mechanical rigidity of the carrier,
   the metal core is directly coated with a ceramic layer having thickness of at most 100 μm,
   the ceramic layer is directly coated in places with a metal layer,
   the semiconductor chips connect electrically to the contact pads via the metal layer,
   the carrier is formed from several carrier parts,
   the ceramic layer of each carrier part forms a single, coherent and closed layer around the associated metal core,
   the carrier top sides each have a larger area than the associated carrier undersides, and
   the carrier parts fixedly connect to one another mechanically via at least one potting body and the potting body together with the carrier parts represents a mechanically bearing component of the semiconductor component so that all carrier undersides end flush with the potting body.

* * * * *